Nov. 8, 1960 P. E. RITT, JR., ET AL 2,959,525

METHOD FOR PLATING AT LEAST TWO DIFFERENT KINDS OF METALS ON PRINTED CIRCUITS

Filed Oct. 11, 1957

I Connector Bars to Be After Plated

II Major Circuit Area

III Board Cut-out Line (Cut on inside of Line)

IV Contact Facility for Plating After Etch.

INVENTORS

Paul E. Ritt Jr.

John R. Sayers Jr.

BY W. Robert Baylor

ATTORNEY

United States Patent Office 2,959,525

Patented Nov. 8, 1960

2,959,525

METHOD FOR PLATING AT LEAST TWO DIFFERENT KINDS OF METALS ON PRINTED CIRCUITS

Paul E. Ritt, Jr., Vienna, and John R. Sayers, Jr., Falls Church, Va., assignors to Melpar, Inc., Falls Church, Va., a corporation of New York Filed Oct. 11, 1957, Ser. No. 689,619

2 Claims. (Cl. 204—15)

This invention relates to a method of electroplating in the electric printed circuit art and more particularly to a method of producing printed circuits by the plating of different kinds of metals upon an insulating base.

In the practice hitherto followed in the printed circuit art, it has been customary to imprint a particular electrical circuit design upon a base member composed of an insulating material. This practice has been accomplished, for example, by plating the base member with a coating of electrically conductive material, masking those portions of the base member on which no electric conductors are to appear, plating the remaining portion with a coating of a different type of conductive material to form the electric conductors on the base member, and then removing the masking material from the unplated portions of the first conductive metal coating. Thus, this leaves the desired electric conductors on the base member. One of the disadvantages that has been encountered in present methods is that the material or etchant used for removing the unwanted portions of the coating of the first electrically conductive material attacks the second coating of a different conductive material. This disadvantage has greatly limited the kinds of metals which can be used for electroplating.

A hard wear resistant metal, such as nickel, is normally attacked by the etchant. A metal, such as rhodium, can be resistant to the etchant only if electroplated under highly critical conditions. Because of these disadvantages, metals of the above type have not been generally accepted for use in electroplating where subsequent exposure to etchant is required, or they have been used with a high rejection rate. The invention described herein provides a method whereby metals of the instant type may be used for electroplating in the printed circuit art in an approved and convenient manner regardless of the etch resistant characteristics of the plated metal.

While the invention may be applied to various metals, it finds particularly successful application in the case of the so-called "nickel" metals especially nickel and nickel-rhodium.

By way of illustration, the invention will be described as applied to nickel metals. It, however, being understood that this particular embodiment of the invention is herein set forth in detail merely by way of example, and that the invention is not limited to such particular embodiment.

An object of the present invention therefore, is to disclose and provide a simple and improved process of plating various nickel metals on a copper clad plastic base.

Another object of the invention is to disclose and provide an improved method, particularly applicable to nickel and rhodium, which virtually eliminates the high rejection rate heretofore encountered in the plating and subsequent etching thereof in the printed circuit art.

A further object of the invention is the provision of providing a more positive method of forming electric conductors and the like on an insulating base with a metal different from the metal plated on the major circuit area of the base.

Still another object is to provide a method of plating a metallic conductive material on a sufficiently wide edge section of a copper clad plastic base whereby current may be conducted for performing the plating of a second metal subsequent to the etching of the first metal.

According to the invention, an improved method of printing circuits on a base of copper clad plastic dielectric laminate has been described herein. This base comprises a major circuit area which includes conductors and connector bars on the lower portion thereof and a minor border or edge current conductive area. The method comprises the steps of: masking the entire base with a photographic resist; masking selected portions of the base by selective exposure of the photographic resist to light through a transparency pattern or patterns; dissolving the unexposed portions with photographic resist developer, developing the unexposed photographic resist; resulting in the formation of photographic images on the copper layer; the images including a printed circuit pattern and a divisional line separating the base into a major circuit area and a minor border area; the photographic images outlining conductors and connector bars on the major circuit area; the connector bars electrically joining the conductors with the border area; plating a layer of solder on the outlined conductors and connector bars and the border area; removing the resist; then subjecting the non-solder plated portions of the major circuit area to a chemical action to remove the unexposed excess copper therefrom; remasking the entire base with exception of the connector bars and also the border area, if desired by painting with a photographic resist; subjecting the photographic resist portions to a period of drying; anodically deplating the solder from the unmasked connector bars and also the border area, if not masked above; applying a thin layer of nickel on the connector bars and also the border area, if not masked above, then, if more durable connector bars are desired, apply a thin layer of rhodium over the nickel plated connector bars and also the border area, if not masked above; remove the masking from the base; utilize the border area as an electrical contact member or facility for the connector bars to form the desired plated conductors; if desired, sever the base along the divisional line separating the major circuit area and the minor border area. Thus, a method of electroplating a printed circuit having durable connector bars and being bonded to a copper clad base is disclosed.

These and various objects, uses and advantages of the present invention will become apparent to those familiar with the practice recommended in the art heretofore, from a contemplation of the description given hereinafter. In order to facilitate understanding reference should be had to the appended drawing in which.

At various places in the specification, reference is made to various chemical names and products, which have been particularly included because, the particular product is on the market, have been found to be satisfactory, and furnishes a ready source of the necessary ingredients.

The steps of the process as shown on the flow diagram have been numbered and those numbers will be employed from time to time in the specification for ready reference and correlation.

As will be readily seen from the contemplation of

Figure 1:
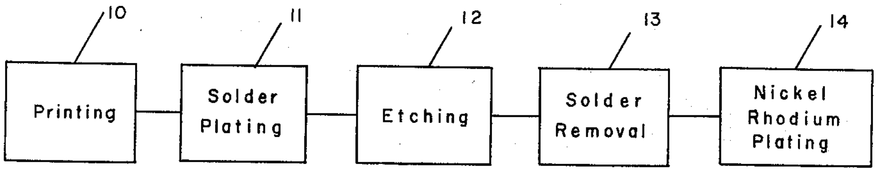
Figure 1 is a block diagram of the process which illustrates the various steps in boxes and arrows to indicate the sequence of operations which is preferably followed in the principal embodiment.

Figure 1 of the drawing, the invention is concerned with a method for plating different types of metals on a copper clad plastic base and comprises essentially the following operations, namely, printing 10, solder or silver plating 11, etching 12, solder removal 13, nickel-rhodium platings 14.

The following description illustrates the manner of carrying out the present invention. However, it is understood that the invention is not limited to the particular details or numerical values set out therein.

Figure 2:
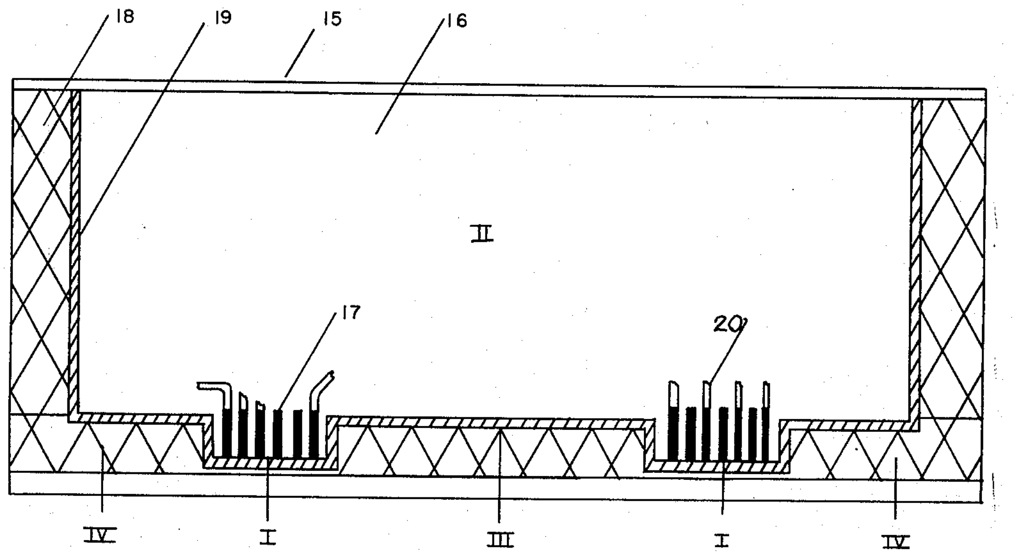
Figure 2 is a plan view of a printed circuit board according to the invention.

According to a preferred embodiment of the invention, as illustrated in Figure 2, a rectangular board 15 composed of a copper clad plastic is disclosed as having a major circuit area 16, connector bars 17 which are plated with nickel and rhodium subsequent to the etching operation, and a border area 18 including a cut-out line 19 which border area 18 serves as a contact facility for the nickel metal platings in that the border area 18 joins all connector bars of the major circuit area 16 for conducting the plating current of the subsequent nickel metal platings.

As stated, the printing step indicated as 10 commences with degreasing the board 15. This may be done by vapor degreasing with an organic solvent such as trichloroethylene, by immersion in an organic solvent such as carbon tetrachloride, or by washing the board with a detergent or an emulsion cleaner. After the degreased board 15 is allowed to dry, it is coated by dipping or by spraying with photoengraver's resist Applicants have used satisfactorily undiluted Kodak photo resist which compositions are described in Patent No. 2,739,892.

It is to be noted that the photographic resist is kept in a clean glass container and used only in sufficient quantities to cover the board 15 when presented horizontally. When the photographic resist is not in use, it should be covered and kept in a darkened chamber.

The board 15 is allowed to dry in a darkened chamber until the photographic resist coating on the board is dry to touch by hand. The board is hung in a vertical position and should be inverted after each additional coating of photographic resist. Warmed air up to 60° centigrade may be used to expedite the drying.

At this point, the board may be again coated with photographic resist as set forth hereinabove. Further, the board is allowed to dry as described above, but the hanging may be inverted this time.

The printing step 10 continues with the introduction of positive transparency or transparencies. The emulsion side of the transparency is placed against the board in a contact frame period. The sensitized board is next subjected to ultra-violet light for ½ to 4 minutes with the light source 15 inches from the frame. Thereby a light pattern corresponding to the printed circuit to be produced is focused on the surface thereof. The pattern includes not only the printed circuit but also the connector or contact bars 17 and the cut-out line 19. The circuit image is developed in photographic resist developer or trichloroethylene vapors. Next, the image is dyed to aid in the visual inspection of the image to produce a satisfactory image. The image is dyed with photographic resist dye by dipping or flowing method. Applicants have used Kodak photo resist dyes which are disclosed in Patent No. 2,241,449. The excess dye is rinsed therefrom by placing the board in a slow stream of running water which is maintained at approximately 65° F. After being allowed to dry, the board is visually inspected for any imperfections in the image and for incomplete coverage. When deemed necessary, the imperfections are touched up by application of more photographic resist or asphaltum and then subsequently dried under an infra-red lamp for five to ten minutes.

In accordance with the present process, the solder plating step 11 commences with the printed board being bright dipped until a uniform etching action has been noted. The solder is plated on the connector bars 17, the conductors 20, and the border portion 18 by masking the remaining portions of the base. After rinsing in cold running water, the board is dipped in 10% B.V. fluoboric acid for ten to thirty seconds. The acid dip is followed by a plating of 60% tin-40% lead alloy on the exposed copper by the means of immersion if a fluoborate electrolyte at the current density of 30 amperes per square foot. Preferably the fluoborate electrolyte has the following composition:

| | Lbs./100 gals. |
|---|---|
| 47% stannous fluoborate | 262 |
| 50% lead fluoborate | 77 |
| 48% fluoboric acid | 47.2 |
| Boric acid | 10.3 |
| Gelatine | 4.2 |
| Water | 573 |

The board is then rinsed thoroughly in cold running water and dried.

The etching step 12 begins with the removal of all the exposed resist such as photographic resist developer, toluene or other suitable solvents. After the solvent softens the resist, the exposed resist is mechanically removed by a paper towel and the like. After being allowed to dry, the board is etched in a chromic acid solution which preferably has the following composition:

| | |
|---|---|
| Chromium trioxide, g./liter | 560 |
| Concentrated sulfuric acid, cc./liter | 133.3 |

Remainder of solution is water.

The etching operation continues until all the exposed copper has been removed. Warm air or mechanical agitation and heat may be utilized to expedite the etching action. Again the board is subjected to rinsing and drying actions. At this point a photographic resist is carefully applied in such manner that it touches the edges of contact bars 17 and the inside of border portion 18. Then the resist is subjected to a period of drying. The solder is anodically deplated from the unmasked contact bars 17 and border portion 18 by immersing in a fluoboric strip solution that includes lead cathodes. This aqueous solution is subjected to six volts and preferably contains one volume of 48% fluoboric acid and 52.25 cc. per liter of 30% hydrogen peroxide and 4 volumes of water. Again the board is subjected to rinsing and drying actions.

After removal of the solder plated portions, any metal can be electroplated in its place. In accordance with the present process, the board 15, at this time, is bright dipped in an aqueous solution comprising sulfuric, nitric, and hydrochloric acids as hereinabove described. When a uniform etching action is noted, the board is thoroughly rinsed in cold running water. The step continues by dipping in a 10% B.V. fluoboric acid solution for a period of time that varies from 10 to 30 seconds.

After a rinse, the board is subjected to a simple nickel plating operation whereby a thin layer of .0005 inch of nickel is plated on the contact bars 17 and border portion 18.

This nickel electrolyte may be a Levelume nickel bath which has the following composition:

| | | |
|---|---|---|
| Nickel sulfate | g./l. | 33 |
| Nickel chloride | g./l. | 60 |
| Boric acid | g./l. | 40.25 |
| NL–1 addition agent | g./l. | 26.25 |
| NL–2 addition agent | cc./l. | 2.079 |
| Anti-pit #5 | cc./l. | 2.464 |

Cast carbon nickel anodes.

The above NL–1 addition agent, NL–2 addition agent and Anti-pit #5 are described in Table I, Table III and lines 18 to 30 on page 7, respectively, of Patent No. 2,712,522.

The nickel plating step is carried out at 71°±5° C. with a current density of 10 to 125 amperes per square foot. The step is followed by the usual rinse in cold water.

And if desired, a subsequent plating of a layer of 30 to 40 millionths of an inch of rhodium may be applied to the contact bars 17 and border portion 18. The plating is preferably performed in an electrolyte that contains 1 liter of demineralized water, 40 cc. of concentrated rhodium plating and platinum anodes. This operation is performed at a current density of 30 amperes per square foot and at a temperature of 43° C.±2° C. After a rinse in cold water and a dry by forced air, the electroplater's tape is removed. The entire board including the border portion 18 is pumiced with levigated alumina or other suitable pumice agent and thoroughly rinsed in cold running water. The border portion 18 may be removed by severing along the cutout line 19.

The electroplating of nickel-rhodium metals after the etching step 12 offers the advantages of selectively plating a portion of the printed circuit pattern with any metal that can be electroplated regardless of its resistance to etchants. This selection of any metal is contingent on the theory that the electrolyte for plating the metal does not affect the copper to plastic adhesion.

It is obvious to those skilled in the art that the above described baths and their operating conditions may be varied somewhat to obtain satisfactory boards.

It should be understood, of course, that the foregoing disclosure relates to only a proved embodiment of the invention and that it is intended to cover all changes and modifications of the example of the invention herein chosen for the purpose of the disclosure, which do not constitute departures from the spirit and scope of the invention set forth in the appended claims.

What we claim is:

1. A method of electroplating a printed circuit upon a copper clad plastic base, comprising the steps of: masking the entire base with a photographic resist; masking selected portions of the base by selective exposure of the photographic resist to light through a transparency pattern; dissolving the unexposed portions with photographic resist developer; developing the unexposed photographic resist; resulting in the formation of photographic images on the copper layer; the images including a printed circuit pattern and a divisional line separating the base into a major circuit area and a minor border area; the photographic images outlining conductors and connector bars on the major circuit area; the connector bars electrically joining the conductors with the border area; plating a layer of solder on the outlined conductors and connector bars and the border area; removing the resist; then subjecting the non-solder plated portions of the major circuit area to a chemical action to remove the excess copper therefrom; remasking the entire base with the exception of the connector bars and the border area, by painting with a photographic resist; subjecting the photographic resist portions to a period of drying; anodically deplating the solder from both the unmasked connector bars and border area; applying a thin layer of nickel on both the connector bars and border area; then applying a thin layer of rhodium over both the pickel plated connector bars and border area; removing the masking from the base; both the nickel and rhodium plated border area and connector bars jointly forming an electrical conductive electrode for the solder plated conductors.

2. A method of electroplating a printed circuit upon a copper clad insulated base, comprising the steps of: masking the entire base with a photographic resist; masking selected portions of the base by selective exposure of the photographic resist to light through a transparency pattern; dissolving the unexposed portions with photographic resist developer; developing the unexposed photographic resist; resulting in the formation of photographic images on the copper layer; the images including a printed circuit pattern and a divisional line separating the base into a major circuit area and a minor border area; the photographic images outlining conductors and connector bars on the major circuit area; the connector bars electrically joining the conductors with the border area; plating a layer of electrical conductive material on the outlined conductors and connector bars and the border area; removing the resist; then subjecting the non-conductive plated portions of the major circuit area to a chemical action to remove the unexposed copper therefrom; remasking the entire base with the exception of the connector bars, by painting with a photographic resist; subjecting the photographic resist portions to a period of drying; anodically deplating the electrical conductive material from the unmasked connectors bars; applying a thin layer of nickel on the connector bars; utilizing the border area as an electrical contact facility for the connector bars to form the desired plated conductors; severing the base along the divisional line separating the major circuit area and the minor border area; and the nickel plated connector bars forming an electrical conductive electrode for the electrical conductive plated conductor.

References Cited in the file of this patent

UNITED STATES PATENTS

| | | |
|---|---|---|
| 2,651,871 | Lynden | Sept. 15, 1953 |
| 2,702,252 | Suchoff | Feb. 15, 1955 |
| 2,758,074 | Black | Aug. 7, 1956 |
| 2,834,723 | Robinson | May 13, 1958 |
| 2,861,029 | Bain et al. | Nov. 18, 1958 |

FOREIGN PATENTS

| | | |
|---|---|---|
| 724,379 | Great Britain | Feb. 16, 1955 |

OTHER REFERENCES

Transactions of The Electrochemical Society, vol. 80, 1941, p. 489.